United States Patent
Greene

(10) Patent No.: US 9,514,804 B2
(45) Date of Patent: Dec. 6, 2016

(54) MULTI-STATE CONFIGURATION RAM CELL

(71) Applicant: Microsemi SoC Corporation, San Jose, CA (US)

(72) Inventor: Jonathan W. Greene, Palo Alto, CA (US)

(73) Assignee: Microsemi SoC Corporation, San Jose, CA (US)

( * ) Notice: Subject to any disclaimer, the term of this patent is extended or adjusted under 35 U.S.C. 154(b) by 0 days.

(21) Appl. No.: 14/950,114

(22) Filed: Nov. 24, 2015

(65) Prior Publication Data

US 2016/0180922 A1    Jun. 23, 2016

Related U.S. Application Data

(60) Provisional application No. 62/093,697, filed on Dec. 18, 2014.

(51) Int. Cl.
*G11C 11/412* (2006.01)
*G11C 11/418* (2006.01)
*G11C 5/06* (2006.01)

(52) U.S. Cl.
CPC ............. *G11C 11/412* (2013.01); *G11C 5/063* (2013.01); *G11C 11/418* (2013.01)

(58) Field of Classification Search
CPC .................................................... G11C 11/412
USPC ........................ 365/154, 174, 189.02, 189.05
See application file for complete search history.

(56) References Cited

U.S. PATENT DOCUMENTS 4,858,197 A * 8/1989 Aono ................... G11C 7/1051
                                                                365/190

* cited by examiner

*Primary Examiner* — Hoai V Ho
*Assistant Examiner* — Jay Radke
(74) *Attorney, Agent, or Firm* — Leech Tishman Fuscaldo & Lampl; Kenneth D'Alessandro, Esq.

(57) ABSTRACT

A multi-state static RAM cell includes N NOR gates. Each NOR gate has N−1 inputs and one output. The output of each NOR gate is coupled to a different bit line. Each NOR gate has its inputs connected to the outputs of each of the other NOR gates.

8 Claims, 5 Drawing Sheets

MULTI-STATE CONFIGURATION RAM CELL

CROSS-REFERENCE TO RELATED APPLICATIONS

This application claims the benefit of U.S. Provisional Patent Application No. 62/093,697, filed Dec. 18, 2014, the contents of which are incorporated in this disclosure by reference in their entirety.

BACKGROUND

Some user-programmable integrated circuits, such as field programmable gate array (FPGA) integrated circuits, use static random access memory (RAM) memory to store the configuration data to control routing switches or multiplexers that are used to implement user circuits. FIGS. 1A through 1E show various static RAM switch configurations (see Brown, Francis, Rose, Vranesic, Field Programmable Gate Arrays, 1992). The RAM cell should consume a minimum amount of static power and occupy the smallest possible die area. A simple configuration is shown in FIG. 1A where the output of a single RAM memory cell controls an n-channel pass transistor switch to connect two routing wire segments to each other.

Modern FPGAs generally avoid the need for decoding logic by providing a separate RAM cell for each input of a multiplexer. Thus an N-input multiplexer implemented with a single level of N pass transistor switches would require N RAM cells. Each switch in the multiplexer is controlled by its own RAM cell in a manner similar to the circuit shown in FIG. 1A. It is also common for one RAM cell to be connected to the gates of several pass transistors to control several switches by simultaneously turning them all on or all off.

Some implementations employ CMOS transmission gates instead of single pass transistor switches, as shown in FIG. 1B, where the output of a single RAM memory cell controls an n-channel pass transistor switch connected in parallel with a p-channel pass transistor switch to connect two routing wire segments to each other. The output of the RAM cell is inverted to control the gate of the p-channel pass transistor switch.

FIG. 1C shows two bi-stable RAM cells connected to the control inputs of a 4-input multiplexer to provide a one-of-four connection between four routing wires and a logic cell input (not shown). The circuit of FIG. 1C requires performing one-of-four decoding of the two RAM cell outputs (the decoding is assumed to be inside the box labeled multiplexer) to provide four mutually exclusive signals.

FIG. 1D shows four bi-stable RAM cells controlling a 4:1 multiplexer. Unlike the circuit of FIG. 1C, the circuit of FIG. 1D does not require performing one-of-four decoding of the RAM cell outputs to provide four mutually exclusive signals, at the expense of using twice the number of RAM cells to provide the four mutually exclusive signals. Only one of the RAM cells is programmed to turn on its associated pass transistor to pass a selected one of the inputs to the output.

FIG. 1E shows eight bi-stable RAM cells controlling a 16:1 multiplexer. A first stage of the multiplexer uses four RAM cells to select one of four inputs from each of four first-stage multiplexers having four inputs. A second stage of the multiplexer uses four RAM cells to select the output of one of the four first-stage multiplexers. Like the circuit of FIG. 1D, the circuit of FIG. 1E does not require performing one-of-four decoding of the RAM cell outputs to provide four mutually exclusive signals. Only one of the RAM cells in each stage of the two-stage multiplexer is programmed to turn on its associated pass transistor to pass a selected one of the inputs to the output.

Previous designs use ordinary bistable or two-state SRAM cells, such as that shown in FIG. 2. Each memory cell includes n-channel transistor M1 connected in series with p-channel transistor M2 cross coupled to n-channel transistor M3 connected in series with p-channel transistor M4 as is known in the art.

Each column of RAM memory cells share two complementary bit lines (BL and BL_bar) that are connected to the memory cell by address transistors M5 and M6 and each row of cells share a word line (WL) that controls the gates of the address transistors. The Q output and optionally the Q_bar output may be used to drive the gates of one or more switches. A buffer or inverter may be placed between the Q or Q_bar output and the switch gate(s) to avoid disturbing the state of the RAM cell as the switch source/drain transitions between high and low voltage and circuit capacitance introduces transients on the switch gate.

Data is written to the memory cell using the bit lines when the row of cells is selected using the word line. The cell may also be read through the bit lines, or additional devices may be added to read the state of the RAM cell in other ways. The address transistors M5 and M6 must be larger than the others so that they can overpower the current state of the cell when writing a new state. In FinFET technologies where the sizes of the transistors are quantized, the address transistors would be 2× the size of the other transistors. The sizes of routing multiplexers in FPGAs vary widely. A common size is 16 inputs, implemented as four 4-input multiplexers feeding a 2nd level 4-input multiplexer. Four RAM cells would be used to control the first-level multiplexers, with each RAM cell controlling one switch in each multiplexer. Four more RAM cells would be used to control the switches in the 2nd level multiplexer.

Implementing this architecture requires the use of a fairly large number of transistors. It would be advantageous to provide a multi-state configuration RAM cell that can be configured using a smaller number of transistor devices.

SUMMARY

A multi-state static RAM cell is formed from NOR gates. Each multi-state static RAM cell includes N NOR gates. Each NOR gate has N−1 inputs and one output. The output of each NOR gate is coupled to a different bit line. Each NOR gate has its inputs connected to the outputs of each of the other NOR gates.

According to one embodiment of the present invention, a multi-state static RAM cell includes N NOR gates. Each NOR gate has N−1 inputs and one output. N address transistors, each having a drain, a source, and a gate, the drain of each address transistor coupled to the output of a different one of the NOR gates, the source of each address transistor coupled to a different one of the bit lines, and the gates of all of the address transistors coupled together to the word line. Each NOR gate has its inputs connected to the outputs of each of the other NOR gates.

According to another aspect of the present invention, a method for configuring a multi-state static RAM cell includes providing N NOR gates, each NOR gate having N−1 inputs and an output, cross coupling the NOR gates, and forcing a logic high level at the output of only one of the NOR gates while forcing a logic low level at the outputs of all of the other NOR gates.

One aspect of the method of the present invention includes providing address transistors, each address transistor being coupled between the output of a different one of the NOR gates and a different bit line, each address transistor having a control element coupled to a word line. According to one aspect of this method, forcing a logic high level at the output of only one of the NOR gates while forcing a logic low level at the outputs of all of the other NOR gates includes asserting a write signal on the word line while asserting a logic high level on only one of the bit lines and asserting a logic low level on all of the other bit lines.

BRIEF DESCRIPTION OF THE DRAWINGS

These and other features, aspects and advantages of the present invention will become better understood with regard to the following description, appended claims, and accompanying drawings where:

DESCRIPTION

Persons of ordinary skill in the art will realize that the following description of the present invention is illustrative only and not in any way limiting. Other embodiments of the invention will readily suggest themselves to such skilled persons.

According to one embodiment of the present invention, cross-coupled NOR gates can be cross coupled as shown in the figures below to provide a static RAM cell with more than two stable states.

Figure 3:
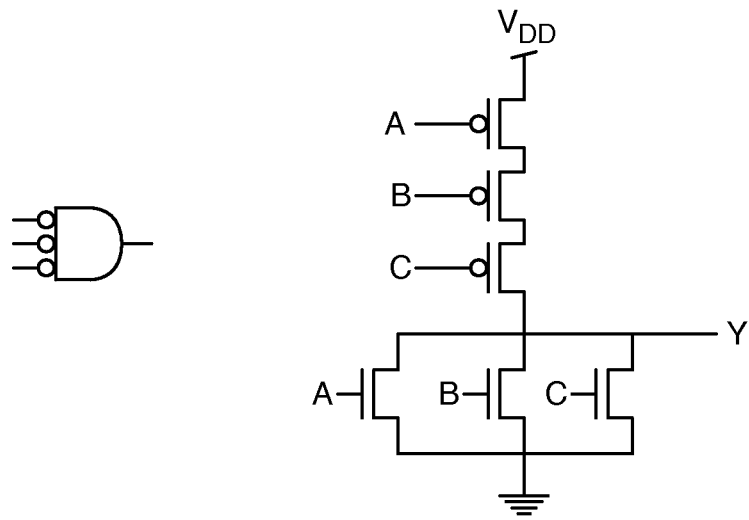
FIG. 3 is a schematic diagram of a typical 3-input NOR gate.

FIG. 3 is a schematic diagram of a typical 3-input CMOS NOR gate, the equivalent AND gate logic symbol of which is shown at the left side of the figure. If inputs A, B, and C are all at logic zero, all three of the series-connected p-channel transistors are turned on and all three of the parallel-connected n-channel transistors are turned off, thus pulling output node Y up to $V_{DD}$. If one or more of inputs A, B, and C are at logic one, one or more of the series-connected p-channel transistors are turned off and one or more of the parallel-connected n-channel transistors are turned on, thus pulling output node Y down to ground.

Figure 4:
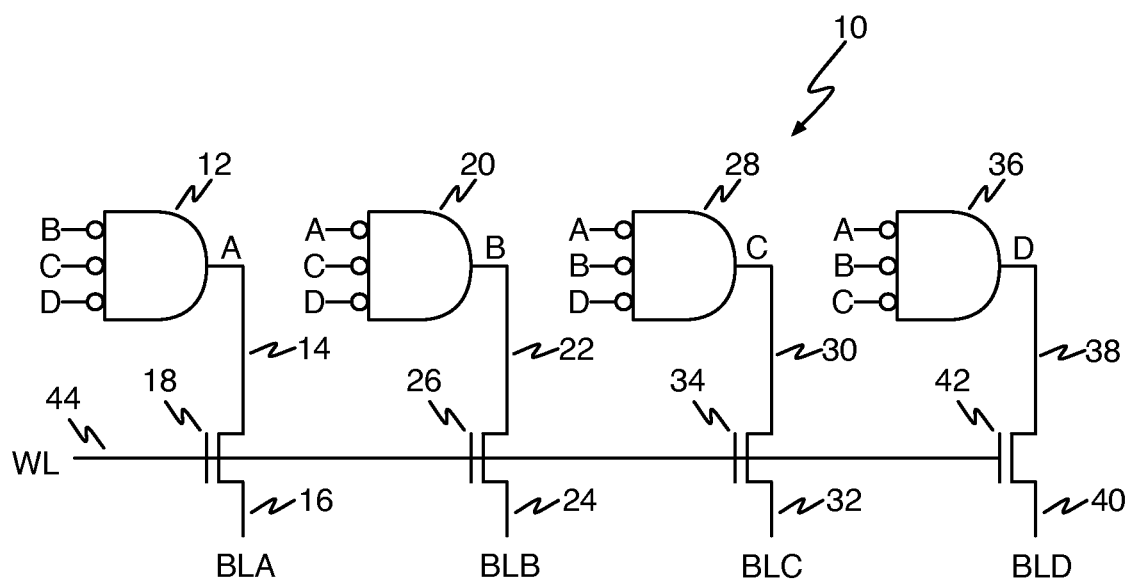
FIG. 4 is a schematic diagram of an illustrative four-state static RAM cell in accordance with one aspect of the present invention.

To illustrate the present invention, the example of a 4-input multiplexer is considered. Rather than use four bi-stable static RAM cells as in the prior art, a single more complex static RAM cell with 4 distinct stable states is used. This can be constructed using four 3-input NOR gates. According to one embodiment of the present invention, a RAM cell 10 having four stable states can be configured from four cross-coupled 3-input NOR gates as shown in FIG. 4. As used in this specification, the term cross-coupled in reference to the NOR gates means that the inputs of each NOR gate are individually coupled to the outputs of the other NOR gates.

Static RAM cell 10 includes four cross coupled 3-input NOR gates. The NOR gates may, as an example, be configured as shown in FIG. 3. NOR gate 12 has an output 14 designated as bit A connected to bit line A (BLA) at reference numeral 16 through address transistor 18. NOR gate 20 has an output 22 designated as bit B connected to bit line B (BLB) at reference numeral 24 through address transistor 26. NOR gate 28 has an output 30 designated as bit C connected to bit line C (BLC) at reference numeral 32 through address transistor 34. NOR gate 36 has an output 38 designated as bit D connected to bit line D (BLD) at reference numeral 40 through address transistor 42. The gates of address transistors 18, 26, 34, and 42 are connected together to word line 44.

The static RAM cell 10 has four outputs: A, B, C and D and has four stable states. In each stable state, one of the outputs A, B, C, and D is high and the others are all low. When output A of NOR gate 12 at reference numeral 14 is high, it forces low the outputs of NOR gates 20, 28, and 36, each of which has A as an input term. When output B of NOR gate 20 at reference numeral 22 is high, it forces low the outputs of NOR gates 12, 28, and 36, each of which has B as an input term. When output C of NOR gate 28 at reference numeral 30 is high, it forces low the outputs of NOR gates 12, 20, and 36, each of which has C as an input term. When output D of NOR gate 36 at reference numeral 38 is high, it forces low the outputs of NOR gates 12, 20, and 28, each of which has D as an input term. Each of outputs A, B, C, and D is able to control a switch in an associated 4-input mux.

Data can be written to the 4-state RAM cell 10 using the four bit lines 16, 24, 32, and 40 (BLA, BLB, BLC and BLD). When the word line 44 is active (logic high), one of the bit lines 16, 24, 32, and 40 is driven high and the others are driven low. The address transistors 18, 26, 34, and 42 controlled by the word line 44 must be large enough that they can overpower the transistors in the NOR gates 12, 20, 28, and 36. However, since the pull-up paths through the p-channel transistors in the all of the NOR gates are stacked (see FIG. 3), even minimum size address transistors are sufficient.

Figure 1A:
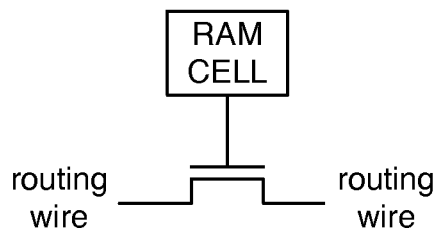
FIGS. 1A through 1E are schematic diagrams illustrating various prior-art configuration RAM cells.
Figure 1B:
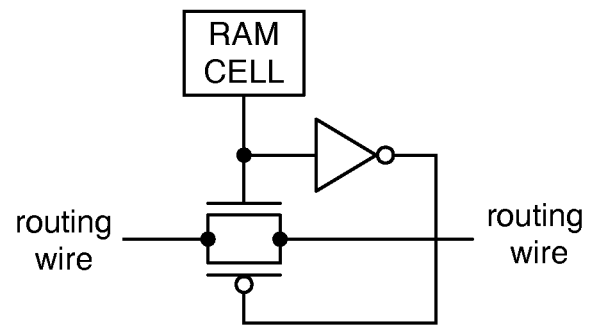
Figure 1C:
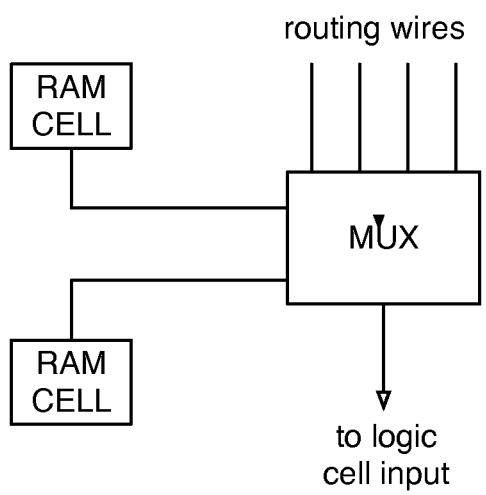
Figure 1D:
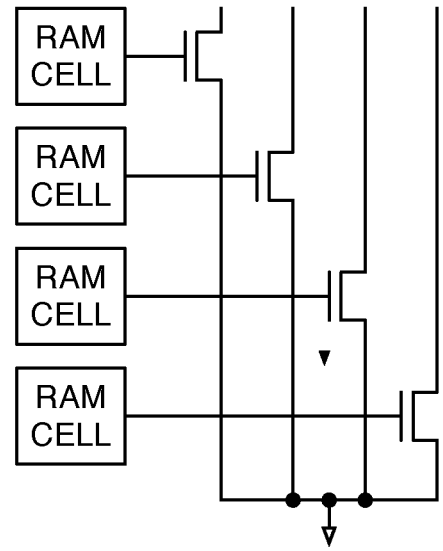
Figure 1E:
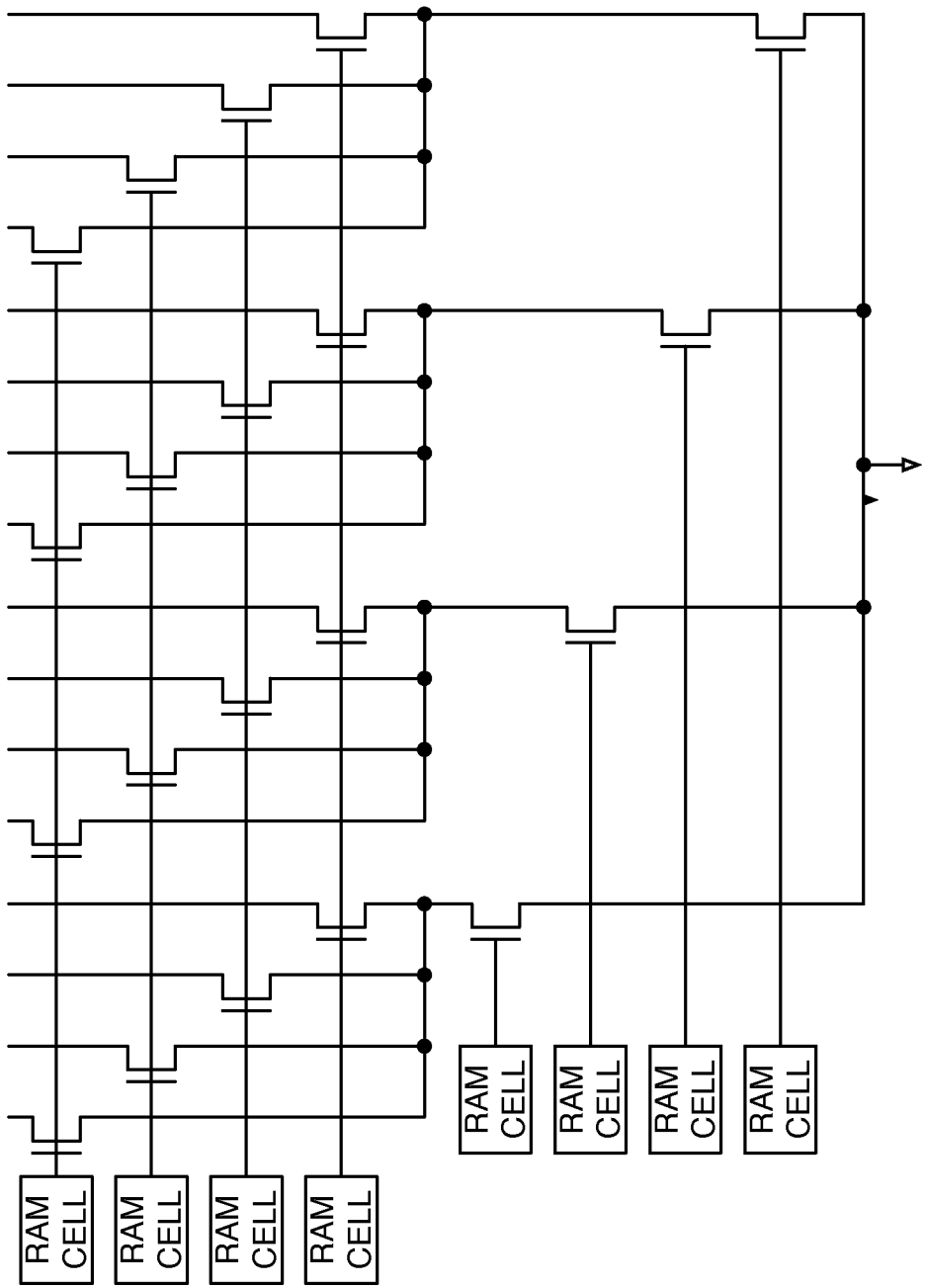
Figure 2:
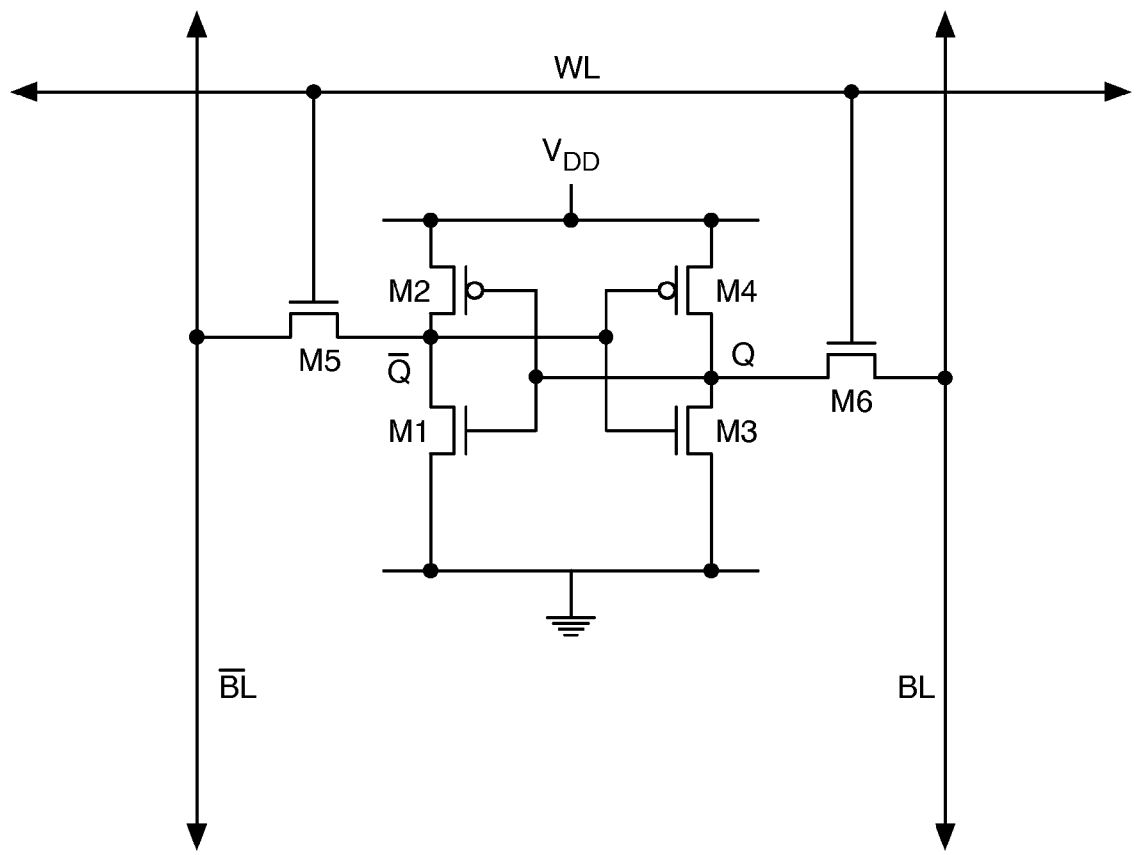
FIG. 2 is a schematic diagram illustrating a typical prior-art bistable RAM cell.

The state of the memory cell can be read on the bit lines as well by asserting a logic high signal on word line 44. Alternately, as is well understood by persons of ordinary skill in the art, additional read devices may be added, as is known for 2-state memory cells such as the one depicted in FIG. 2.

It is calculated that the relative die area of a static RAM memory cell configured using the approach of the present invention in units of minimum-sized transistor areas is smaller than the area of an equivalent conventional static RAM memory cell. The four 2-state static RAM memory cells needed in the conventional approach would require a total of 24 transistors, of which 8 are double-width addressing devices, for a total of 32 area units. The total number of transistors in the four-state static RAM memory cell of the present invention is 28, all of which can be minimum sized.

Four conventional 2-state static RAM memory cells would require 8 bit lines. The 4-state static RAM cell of FIG. 4 uses only 4 bit lines. This results in saving some metal routing area on the die.

The static power consumed by the 4-state static RAM memory cell of the present invention can be lower than the static power consumed by four conventional 2-state static RAM memory cells. Each conventional 2-state static RAM memory cell has two leaking devices in the inverters, for a total of 8 leaking devices in a group of four cells. In addition, the address transistors may leak depending on the state of the bit lines. In the 4-state static memory cell of the present invention, only one of the four NOR gates 12, 20, 28, and 36 has a high output, with three leaking N-channel devices. In the other three NOR gates, the P-channel devices are leaking, but because they are stacked (three in series, two on and one off) the leakage would be reduced. The total leakage can be as little as ⅜ of the leakage encountered in the conventional prior art approach.

Figure 5:
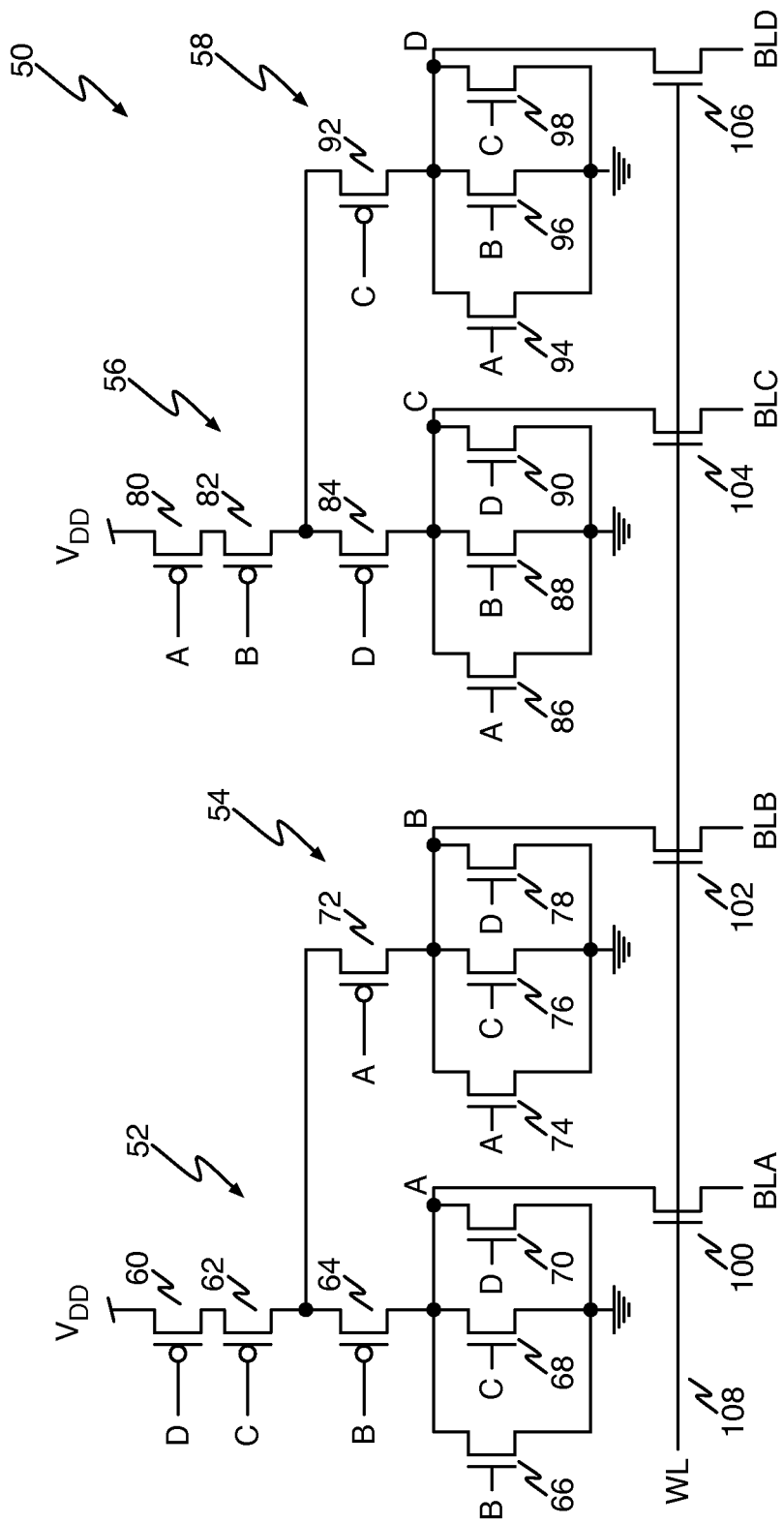
FIG. 5 is a schematic diagram of an alternate configuration of a NOR gate suitable for use in the present invention.

Referring now to FIG. 5, a schematic diagram shows an alternative architecture for the NOR gates that provides further reductions in the transistor count of the 4-state static RAM memory cell of the present invention. In FIG. 5, four-state static RAM cell 50 includes NOR gates 52, 54, 56, and 58. NOR gate 52 includes stacked p-channel transistors 60, 62, and 64, and parallel n-channel transistors 66, 68, and 70. NOR gate 54 includes stacked p-channel transistors 60, 62, and 72, and parallel n-channel transistors 74, 76, and 78. NOR gate 56 includes stacked p-channel transistors 80, 82, and 84, and parallel n-channel transistors 86, 88, and 90. NOR gate 58 includes stacked p-channel transistors 80, 82, and 92, and parallel n-channel transistors 94, 96, and 98. NOR gate 54 shares p-channel transistors 60 and 62 with NOR gate 52. NOR gate 58 shares p-channel transistors 80 and 82 with NOR gate 56.

In one embodiment, address transistors 100, 102, 104, and 106, respectively, couple output A of NOR gate 52, output B of NOR gate 54, output C of NOR gate 56, and output D of NOR gate 58, to respective bit lines BLA, BLB, BLC and BLD responsive to word line 108. Persons of ordinary skill in the art will recognize that, if the four address transistors 100, 102, 104, and 106 are omitted, the die area can be further reduced to 24 transistors versus the 32 transistors needed for the prior art approach, a die area reduction of 25%.

While the multi-state configuration static RAM cell of the present invention has been illustrated as an embodiment allowing four states, other numbers of states can be implemented according to the principles illustrated in FIGS. 4 and 5. Four is a convenient number of states because the static RAM memory cell is not too complex and yet 4-state static RAM memory cells suffice to implement a 16:1 multiplexer formed from five 4:1 multiplexers with the four first level multiplexers sharing control signals. The 4-state static RAM memory cell embodiment of FIGS. 4 and 5 can be generalized to N states. In an embodiment of a static RAM memory cell having N states, N NOR gates are employed. Each NOR gate has N−1 inputs. The inputs of each NOR gate are each connected to a different one of the outputs of the other NOR gates.

Although the present invention has been discussed in considerable detail with reference to certain preferred embodiments, other embodiments are possible. Therefore, the scope of the appended claims should not be limited to the description of preferred embodiments contained in this disclosure.

What is claimed is:

1. A multi-state static RAM cell comprising:
    N NOR gates, each of the N NOR gates having N−1 inputs and one output, where N is an integer greater than 2;
    N bit lines;
    wherein each input of each of the N NOR gates is directly connected to the output of a different one of the other N NOR gates.

2. The multi-state static RAM cell of claim 1 further comprising:
    a word line; and
    N address transistors, each address transistor having a drain, a source, and a gate, the drain of each address transistor coupled to the output of a different one of the NOR gates, the source of each address transistor coupled to a different one of the bit lines, and the gates of all of the address transistors coupled together to the word line.

3. The multi-state static RAM cell of claim 2 wherein the address transistors are sized to be large enough to overpower transistors used to form the NOR gates.

4. A multi-state static RAM cell comprising:
    first, second, third, and fourth NOR gates, each NOR gate having three inputs and one output;
    first, second, third, and fourth bit lines;
    wherein the output of the first NOR gate is coupled to the first bit line and to the inputs of the second, third, and fourth NOR gates, the output of the second NOR gate is coupled to the second bit line and to the inputs of the first, third, and fourth NOR gates, the output of the third NOR gate is coupled to the third bit line and to the inputs of the first, second, and fourth NOR gates, and the output of the fourth NOR gate is coupled to the fourth bit line and to the inputs of the first, second, and third NOR gates.

5. The multi-state static RAM cell of claim 4 further comprising:
    a word line; and first, second, third, and fourth address transistors, each address transistor having a drain, a source, and a gate, the drain of the first address transistor coupled to the output of the first NOR gate, the drain of the second address transistor coupled to the output of the second NOR gate, the drain of the third address transistor coupled to the output of the third NOR gate, the drain of the fourth address transistor coupled to the output of the fourth NOR gate, the source of the first address transistor coupled to the first bit line, the source of the second address transistor coupled to the second bit line, the source of the third address transistor coupled to the third bit line, the source of the fourth address transistor coupled to the fourth bit line, and the gates of all of the first, second, third, and fourth address transistors coupled together to the word line.

6. The multi-state static RAM cell of claim 5 wherein the first, second, third, and fourth address transistors are sized to be large enough to overpower transistors used to form the NOR gates.

7. A method for configuring a multi-state static RAM cell comprising:
    providing N NOR gates, N being an integer greater than 2, each NOR gate having N−1 inputs and an output;
    cross coupling the NOR gates; and
    forcing a logic high level at the output of only one of the N NOR gates which causes a logic low level at the output of each of the other ones of the N NOR gates.

8. The method of claim 7, further comprising:
    providing address transistors, each address transistor coupled between the output of a different one of the NOR gates and a different bit line, each address transistor having a control element coupled to a word line; and
    wherein forcing a logic high level at the output of only one of the NOR gates while forcing a logic low level at the outputs of all of the other NOR gates comprises asserting a logic high level on only one of the bit lines, asserting a logic low level on all of the other bit lines, and asserting a write signal on the word line.

* * * * *